United States Patent
Ku et al.

(10) Patent No.: US 10,340,017 B2
(45) Date of Patent: Jul. 2, 2019

(54) ERASE-VERIFY METHOD FOR THREE-DIMENSIONAL MEMORIES AND MEMORY SYSTEM

(71) Applicant: MACRONIX INTERNATIONAL CO., LTD., Hsinchu (TW)

(72) Inventors: Shaw-Hung Ku, Hsinchu (TW); Yu-Hung Huang, Tainan (TW); Cheng-Hsien Cheng, Yunlin County (TW); Chih-Wei Lee, New Taipei (TW); Atsuhiro Suzuki, Hsinchu (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/803,986

(22) Filed: Nov. 6, 2017

(65) Prior Publication Data
US 2019/0139615 A1    May 9, 2019

(51) Int. Cl.
*G11C 11/34* (2006.01)
*G11C 16/34* (2006.01)
*G11C 16/16* (2006.01)
*G11C 8/14* (2006.01)

(52) U.S. Cl.
CPC .......... *G11C 16/3445* (2013.01); *G11C 8/14* (2013.01); *G11C 16/16* (2013.01); *G11C 2211/5648* (2013.01)

(58) Field of Classification Search
CPC ....... G11C 16/3445; G11C 8/14; G11C 16/16; G11C 2211/5648

USPC ............................................ 365/185.29, 218
See application file for complete search history.

(56) References Cited

U.S. PATENT DOCUMENTS

| | | | | |
|---|---|---|---|---|
| 7,272,050 B2* | 9/2007 | Han | ............... | G11C 16/0483 365/185.22 |
| 7,429,138 B2* | 9/2008 | Nakamura | ......... | G02B 6/02038 385/123 |
| 7,768,826 B2* | 8/2010 | Ito | .................. | G11C 16/3477 365/185.02 |
| 7,872,921 B2* | 1/2011 | Kim | ................... | G11C 8/08 365/185.17 |
| 7,916,548 B2* | 3/2011 | Futatsuyama | ........ | G11C 16/344 365/185.18 |

(Continued)

OTHER PUBLICATIONS

TIPO Office Action dated Jul. 6, 2018 in Taiwan application (No. 106138374).

*Primary Examiner* — Viet Q Nguyen
(74) *Attorney, Agent, or Firm* — McClure, Qualey & Rodack, LLP

(57) ABSTRACT

An erase-verify method for a three-dimensional (3D) memory and a memory system are provided. The 3D memory includes at least one memory cell string including a plurality of memory cells, and the memory cells include a first group of memory cells and a second group of memory cells. Each of the memory cells is coupled to a word line. The method comprises the following steps. A first erase-verify operation is performed on the first group of memory cells. After performing the first erase-verify operation on the first group of memory cells, a second erase-verify operation is performed on the second group of memory cells in condition that the first group of memory cells are verified as erased successfully.

12 Claims, 9 Drawing Sheets

(56) References Cited

U.S. PATENT DOCUMENTS

| | | | |
|---|---|---|---|
| 8,130,555 B2* | 3/2012 | Hazama | G11C 16/0483 365/185.17 |
| 8,218,367 B2* | 7/2012 | Hemink | G11C 16/3418 365/185.17 |
| 8,929,148 B2* | 1/2015 | Kim | G11C 16/3445 365/185.22 |
| 9,236,139 B1* | 1/2016 | Lai | G11C 16/3427 |
| 9,343,160 B1* | 5/2016 | Dutta | G11C 11/5635 |
| 9,343,171 B1 | 5/2016 | Sun et al. | |
| 9,672,931 B2* | 6/2017 | Yoon | G11C 16/3445 |
| 9,704,596 B1* | 7/2017 | Shim | G11C 16/3445 |
| 2005/0265081 A1* | 12/2005 | Tran | G11C 16/3468 365/185.29 |
| 2008/0089135 A1* | 4/2008 | Ito | G11C 16/16 365/185.29 |
| 2008/0158994 A1* | 7/2008 | Yang | G11C 11/5635 365/185.22 |
| 2008/0159009 A1* | 7/2008 | Aritome | G11C 16/0483 365/185.29 |
| 2008/0165585 A1* | 7/2008 | Surico | G11C 16/344 365/185.22 |
| 2008/0219053 A1* | 9/2008 | Kim | G11C 16/0483 365/185.11 |
| 2009/0010071 A1* | 1/2009 | Lee | G11C 16/16 365/185.22 |
| 2009/0296475 A1* | 12/2009 | Hemink | G11C 16/3418 365/185.17 |
| 2010/0054019 A1 | 3/2010 | Toda | |
| 2012/0275232 A1* | 11/2012 | Park | G11C 16/0483 365/185.19 |
| 2013/0128667 A1* | 5/2013 | Lee | G11C 16/10 365/185.11 |
| 2014/0085982 A1* | 3/2014 | Asaoka | G11C 16/06 365/185.17 |
| 2014/0140136 A1 | 5/2014 | Jung | |
| 2014/0198575 A1* | 7/2014 | Dutta | G11C 16/3418 365/185.17 |
| 2014/0226407 A1 | 8/2014 | Izumi | |
| 2014/0226414 A1* | 8/2014 | Costa | G11C 16/3445 365/185.22 |
| 2015/0221380 A1 | 8/2015 | Lee | |
| 2016/0027504 A1* | 1/2016 | Lee | G11C 11/5635 365/185.03 |
| 2016/0064088 A1* | 3/2016 | Shiga | G11C 16/14 365/185.17 |
| 2016/0078953 A1 | 3/2016 | Bushnaq et al. | |
| 2016/0225415 A1* | 8/2016 | Lee | G11C 16/16 |
| 2017/0162259 A1 | 6/2017 | Kim | |

\* cited by examiner

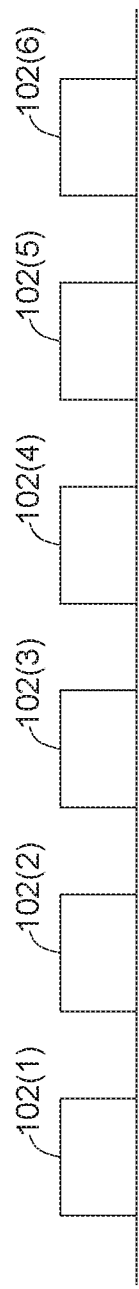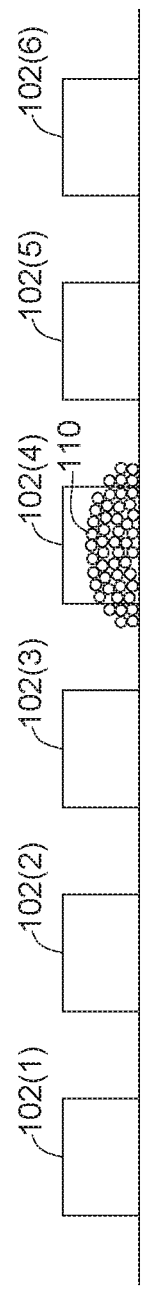

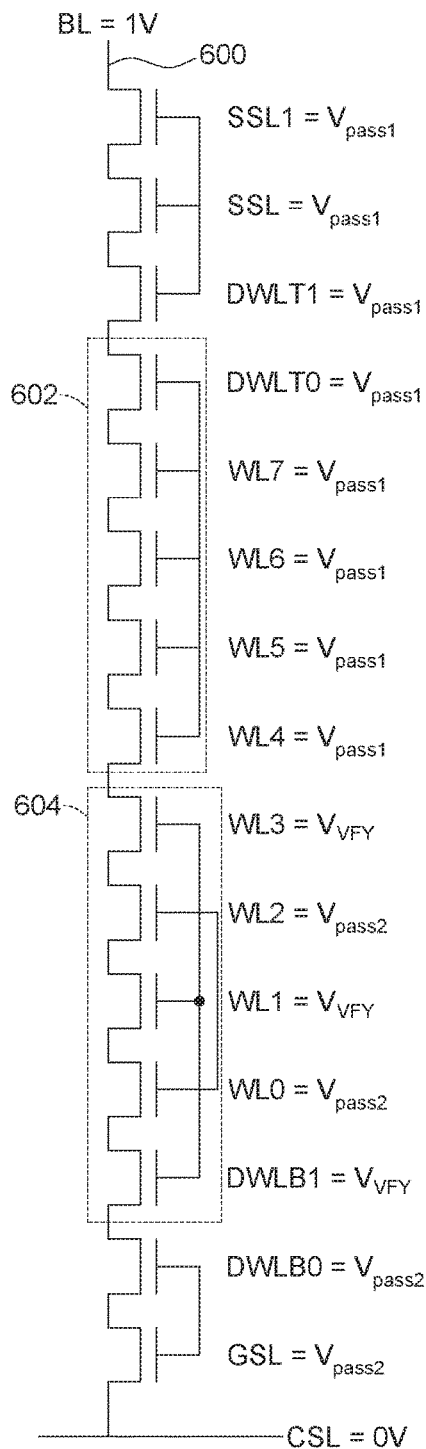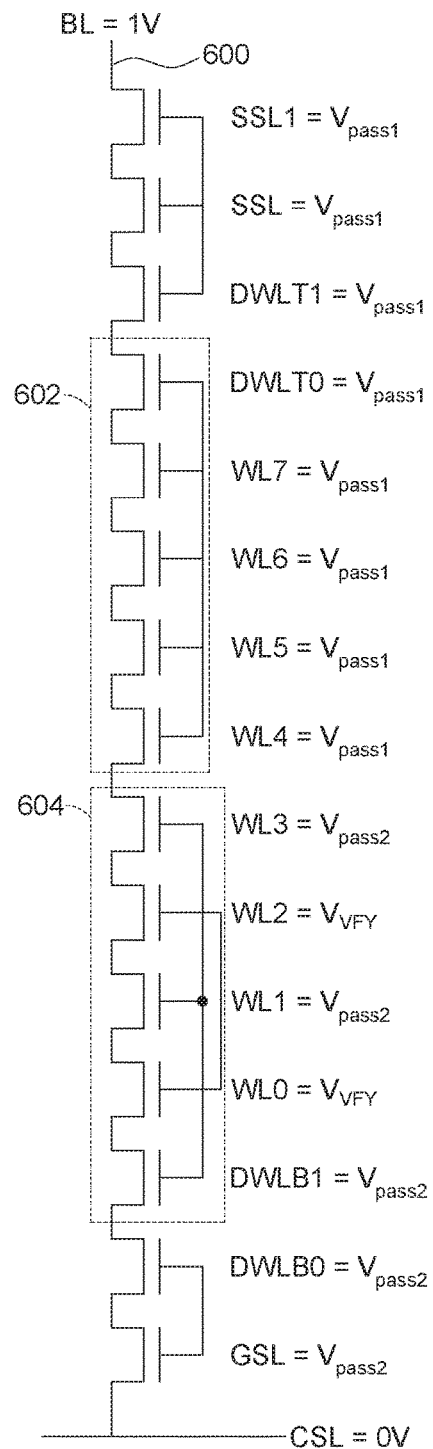
FIG. 6B                    FIG. 6C

ERASE-VERIFY METHOD FOR THREE-DIMENSIONAL MEMORIES AND MEMORY SYSTEM

TECHNICAL FIELD

The disclosure relates to a three-dimensional memory, especially an erase-verify method for a three-dimensional memory and a memory system.

BACKGROUND

In the recent years, memories are becoming ubiquitous and commonly used in various electronic devices, such as personal computers, laptop computers, smart phones, tablets, digital cameras, and etc. In order to increase memory density, memory designs have used three-dimensional (3D) architectures. A 3D memory includes more memory cells than a two-dimensional (2D) memory. As the number of memory cells increases, the number of signal lines, e.g. bit lines and/or word lines, increases accordingly.

The radius of upper layers of a 3D memory may be greater than the radius of lower layers of the 3D memory, taking a substrate of the 3D memory as a bottommost layer, and thus in an erase-verify operation, the effect of electric field of a erase-verify voltage applied on upper layers of the 3D memory is different from the effect of electric field of the erase-verify voltages applied on lower layers of the 3D memory. In addition, residual charges would result in an erase-verify failure of the erase-verify operation.

Accordingly, there is a need for an erase-verify method for a three-dimensional memory and a memory system.

SUMMARY OF THE INVENTION

The invention is related to an erase-verify method for a three-dimensional memory and a memory system. By means of the present invention, multiple erase-verify operations are separately performed on different groups of memory cells of a memory cell string. The probability of an erase-verify failure induced by the presence of residual charge can be reduced.

According to a first aspect of the present invention, an erase-verify method for a three-dimensional (3D) memory is provided. The 3D memory includes at least one memory cell string including a plurality of memory cells, and the memory cells include a first group of memory cells and a second group of memory cells or more groups based on the amount of the memory cell in one memory cell string. Two-group erase-verify is introduced to simplify the operation. Each of the memory cells is coupled to a word line. The method comprises the following steps. A first erase-verify operation is performed on the first group of memory cells. After performing the first erase-verify operation on the first group of memory cells, a second erase-verify operation is performed on the second group of memory cells in condition that the first group of memory cells are verified as erased.

According to a second aspect of the present invention, a memory system is provided. The memory system comprises a three dimensional (3D) memory and a controller. The 3D memory includes at least one memory cell string. The at least one memory cell string extends vertically through layers of the 3D memory and includes a plurality of memory cells. The memory cells include a first group of memory cells and a second group of memory cells, and each of the memory cells is coupled to a word line. The controller is coupled to the 3D memory and performs a first erase-verify operation on the first group of memory cells. After performing the first erase-verify operation on the first group of memory cells, the controller performs a second erase-verify operation on the second group of memory cells in condition that the first group of memory cells are verified as erased successfully.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 1A shows a schematic diagram illustrating a memory cell string including a plurality of memory cells.

FIG. 1B shows a schematic diagram illustrating a programmed memory cell of a memory cell string with trapped charges.

Figure 1C:
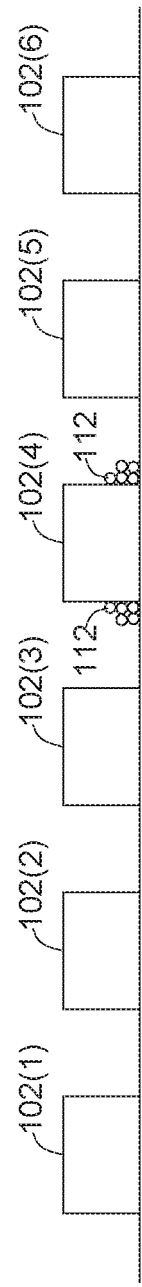
FIG. 1C shows a schematic diagram illustrating a memory cell string with residual charges.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIGS. 1A, 1B and 1C. FIG. 1A shows a schematic diagram illustrating a memory cell string including a plurality of memory cells. FIG. 1B shows a schematic diagram illustrating a programmed memory cell of a memory cell string with trapped charges. FIG. 1C shows a schematic diagram illustrating a memory cell string with residual charges. FIG. 1A illustrates a memory cell string including memory cells 102, for example, memory cells 102(1), 102(2), 102(3), 102(4), 102(5), and 102(6). After the memory cell 102(4) is programmed, charges 110 are trapped in the memory cell 102(4). However, extended time or exposure to high temperatures may result in that some of the charges 110 trapped in the memory cell 102(4) are lost over time and not trapped in the memory cell 102(4), and the lost charges remain in areas adjacent to the memory cell 102(4) and are located between the memory cell 102(3) and memory cell 102(4) and/or between the memory cell 102(4) and memory cell 102(5), as illustrated in FIG. 1B. Thus, after an erase operation is performed on the memory cell string, the charges 110 trapped in the memory cell 102(4) could be removed, but the charges 110 between the memory cell 102(3) and memory cell 102(4) and/or between the memory cell 102(4) and memory cell 102(5) are left. The left charges 110 result in residual charges 112, as illustrated in FIG. 1C. The presence of the residual charge 112 can lead to an erase-verify failure when an erase-verify operation is performed on the memory cell string.

In order to eliminate the erase-verify failure resulting from the residual charge, a pass voltage is applied to world lines connected to the memory cells 102(3) and 102(5) which neighbor the memory cell 102(4) to "mask" the residual charges 112, and an erase-verify voltage for verifying whether the memory cell 102(4) is erased successfully is applied to the memory cell 102(4), wherein the pass voltage is greater than the erase-verify voltage. Thus, the probability of erase-verify failure resulting from the residual charge would be reduced. The term "mask" means that the influence brought by the residual charges 112 around the memory cell 102(4) could be ignored temporarily on account of the electric field of the pass voltage applied on the memory cells 102(3) and 102(5).

Figure 2:
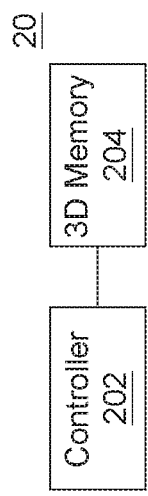
FIG. 2 is a block diagram illustrating a memory system according to one embodiment of the present disclosure.

FIG. 2 is a block diagram illustrating a memory system 20 according to one embodiment of the present invention. The memory system 20 includes a controller 202 and a three-dimensional (3D) memory 204. The 3D memory 204 includes a plurality of memory cell strings which are arrange in a form of matrix. The memory cell strings extend vertically through layers of the 3D memory 204 and each of the memory cell strings includes a plurality of memory cells. Memory cells of a memory cell string include a first group of memory cells and a second group of memory cells, and each of the memory cells coupled to a word line. The first group of memory cells is adjacent to one another, and the second group of memory cells is adjacent to one another. In other embodiments of the present invention, memory cells of a memory cell string include more than two groups of memory cells based on the amount of the memory cells in the memory cell string. The word lines include interleaving even and odd word lines. For example, the 3D memory 204 may be a non-volatile memory retaining its information when the power is turned off, such as a NAND flash memory or a resistive random access memory (Re RAM).

The control 202 is coupled to the 3D memory 204. For example, the controller 202 can be implemented by a chip, a circuit block in a chip, a circuit board including a number of electric elements and a number of conductive wires, or a computer readable medium storing a number of program codes. The control 202 is used to control the operation mode of the 3D memory 204 in response to some external instructions from an interface (not shown in FIG. 2) via a bus. For example, the interface is an input/out interface. The operation mode is one of programming (writing) operation, reading operation, and erasing operation.

The controller 202 performs an erase operation by providing an erase voltage to erase memory cells of the 3D memory 204 and performs an erase-verify operation by providing an erase-verify voltage to verify whether the erased cells are successfully erased. For example, after the controller 202 performs an erase operation on a memory cell string of the 3D memory 204, the controller 202 determines whether the memory cell string is erased successfully by applying an erase-verify voltage (e.g. between 0V and 1V) to the memory cell string in an erase-verify operation. The memory cell string is deemed as erased successfully in condition that a sensing current could flows through the memory cell string when the erase-verify voltage is applied to the memory cell string. The memory cell string would be set as erased unsuccessfully in condition that the sensing current cannot flow through the memory cell string.

Figure 3:
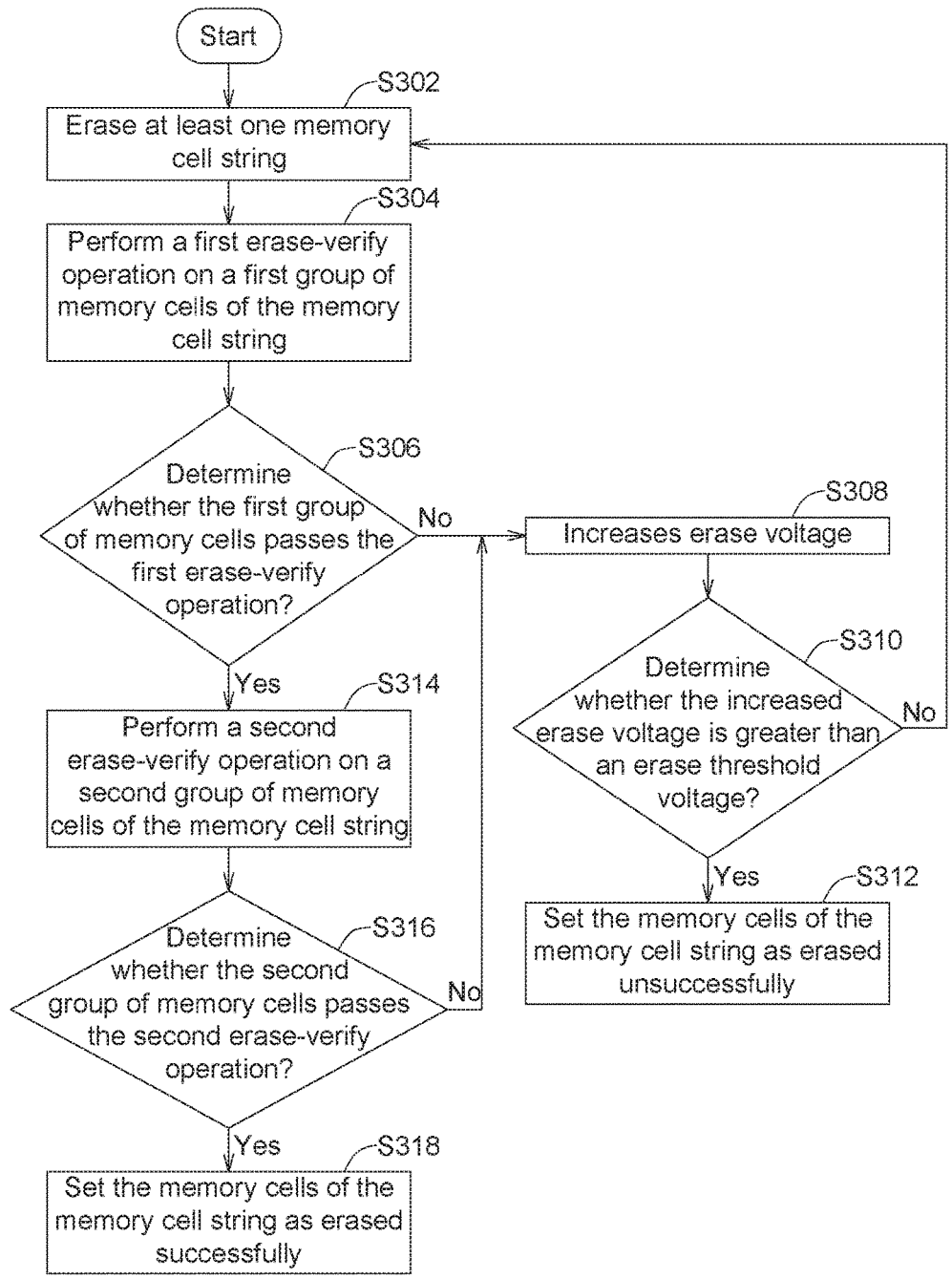
FIG. 3 illustrates a flow diagram for an erase-verify method for a three-dimensional memory according to one embodiment of the present disclosure.

FIG. 3 illustrates a flow diagram for an erase-verify method for a 3D memory according to one embodiment of this invention. To clearly illustrate the operation of the various elements of the above-described embodiments and the present embodiment, the erase-verify method for the 3D memory is described with the following detailed description of a flowchart below. However, those skilled in the art can understand, the method of the present embodiment is applied but not limited to the memory system 20 in FIG. 2, and it is not limited to the order of the steps of the flowchart. Although the example technique involves operations being performed in a specific order, variants of the technique according to some embodiments can involve these or different operations being performed in different orders.

Please refer to FIGS. 2 and 3. According to an embodiment of the present invention, the erase-verify method begins at step S302. At step S302, the controller 202 receives an instruction of erase mode from an interface to change the operation mode of the 3D memory 204 to an erase operation. The erase operation includes erasing at least one memory cell string of the 3D memory 204 by providing an erase voltage to word lines connected to the memory cells of the memory cell string. In other words, the controller 202 erases the memory cell string by providing an erase voltage to the memory cells of the memory cell string.

Next, the controller 202 performs an erase-verify operation including a first erase-verify operation and a second erase-verify operation. At step S304, the controller 202 performs a first erase-verify operation on a first group of memory cells of the memory cell string. Next, at step S306, the controller 202 determines whether the first group of memory cells passes the first erase-verify operation.

If the first group of memory cells does not pass the first erase-verify operation (the result of step S306 is No), the method proceeds to step S308. At step S308, the controller 202 increases the erase voltage, and then the controller 202 determines whether the increased erase voltage is greater than an erase threshold voltage at step S310.

If the increased erase voltage is less than or equal to the erase threshold voltage (the result of step S310 is No), the method proceeds to step S302 again. The controller 202 performs the erase operation on the memory cell string again by applying the increased erase voltage to the memory cells of the memory cell string. If the increased erase voltage is greater than the erase threshold voltage (the result of step S310 is yes), the method proceeds to step S312. The controller 202 sets the memory cells of the memory cell string as erased unsuccessfully at step S312.

If the first group of memory cells passes the first erase-verify operation (the result of step S306 is yes), the method proceeds to step S314. At step S314, the controller 202 performs a second erase-verify operation on a second group of memory cells of the memory cell string after performing the first erase-verify operation on the first group of memory cells. The controller 202 performs the second erase-verify operation after the first group of memory cells passes the first erase-verify operation. In other words, the controller 202 performs the second erase-verify operation in condition that the first group of memory cells is verified as erased successfully. Next, at step S316, the controller 202 determines whether the second group of memory cells passes the second erase-verify operation.

If the second group of memory cells does not pass the second erase-verify operation (the result of step S316 is No), the method proceeds to step S308. If the second group of memory cells passes the second erase-verify operation (the result of step S316 is yes), the method proceeds to step S318. The controller 202 sets the memory cells of the memory cell string as erased successfully at step S318. In other words, the controller 202 sets the memory cells of the memory cell string as erased successfully in condition that the first group of memory cells and the second group of memory cells pass the first erase-verify operation and the second erase-verify operation respectively, i.e. the first group of memory cells and the second group of memory cells are respectively verified as erased successfully in the first erase-verify operation and the second erase-verify operation.

Below, the first erase-verify operation and the second erase-verify operation mentioned above will be described in detail with reference to accompanying drawings. Please refer to FIGS. 4A to 7D. FIGS. 4A to 7D show diagrams illustrating an erase-verify operation including a first erase-verify operation performed on a first group of memory cells and a second erase-verify operation performed on a second group of memory cells according to embodiments of this invention.

Memory cell strings 400, 500, 600, and 700 in FIGS. 4A to 7D have the same or similar configuration. For example, each of the memory cell strings 400, 500, 600, and 700 includes eight memory cells and is coupled to a bit line BL, two string select line, SSL0 and SSD1, two top dummy word lines, DWLT0 and DWLT1, eight word lines, WL0~WL7, two bottom dummy word lines, DWLB0 and DWLB1, a ground select line GSL, and a common source line CSL. It should be appreciated that the number of the memory cells included in each of the memory cell strings 400, 500, 600, and 700 could be any positive integer, not limited to the number of eight.

Figure 4A:
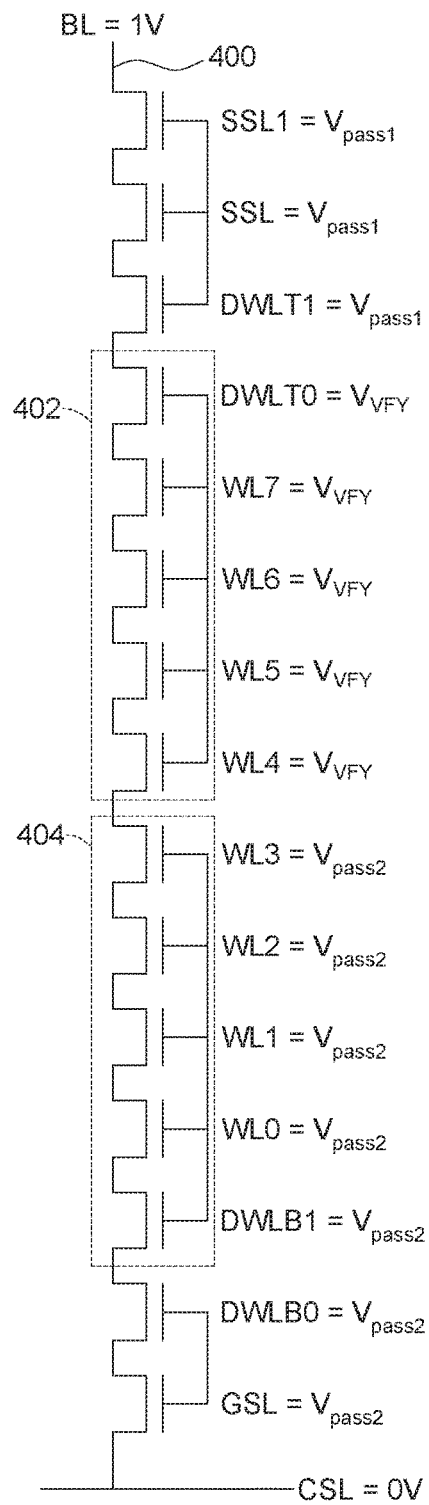
FIGS. 4A to 7D show diagrams illustrating an erase-verify operation including a first erase-verify operation performed on a first group of memory cells and a second erase-verify operation performed on a second group of memory cells according to embodiments of this invention.
Figure 4B:
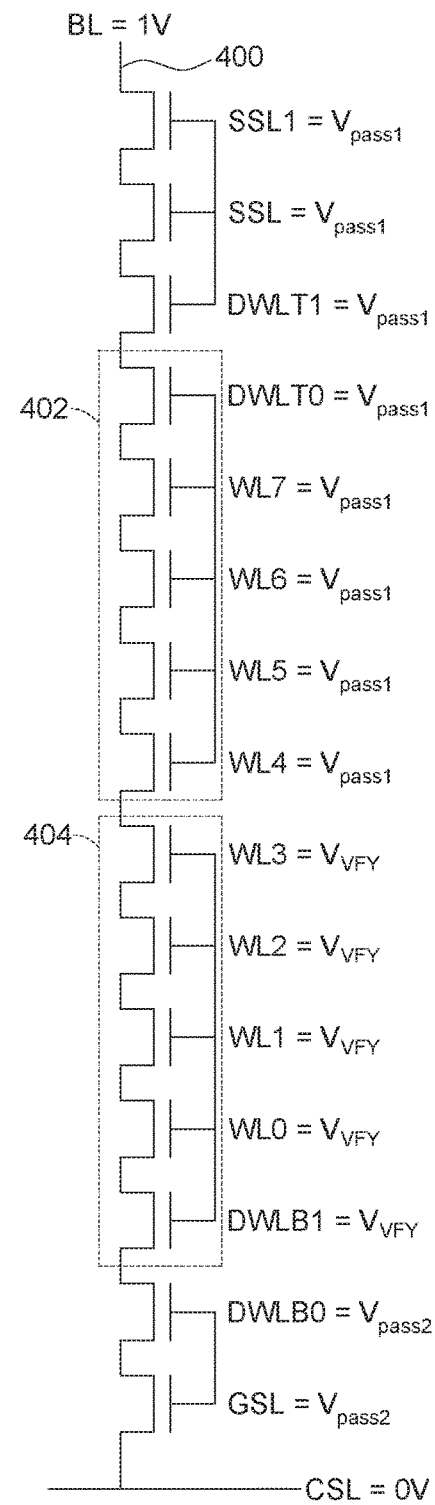

Please refer to FIGS. 4A and 4B. In this embodiment of the present invention, the memory cells of the memory cell string 400 include a first group of memory cells 402 and a second group of memory cells 404. FIG. 4A illustrates that a first erase-verify operation only is performed on the first group of memory cells 402, and 4B illustrates that a second erase-verify operation only is performed on the second group of memory cells 404. The first group of memory cells 402 comprises the memory cells connected to the word lines WL4, WL5, WL6, and WL7 and a dummy cell connected to the top dummy word line DWLT0. The second group of memory cells 404 comprises the memory cells connected to the word lines WL0, WL1, WL2, and WL3 and a dummy cell connected to the bottom dummy word line DWLB1.

When the controller 202 performs the first erase-verify operation on the first group of memory cells 402, as shown in FIG. 4A, the controller 202 provides a positive voltage (e.g. 1V) to the bit line BL and a voltage (e.g. 0V) to the common source line CSL. The controller 202 applies an erase-verify voltage $V_{VFY}$ ((e.g. between 0V and 1V) to the word lines connected to the first group of memory cells 402, i.e. the erase-verify voltage $V_{VFY}$ is applied to the word lines WL4~WL7 and the top dummy word line DWLT0. The string select lines SSL0 and SSL1 and the top dummy word line DWLT1 are biased as a first pass voltage $V_{pass1}$. In addition, the controller 202 applies a second pass voltage $V_{pass2}$ to the word lines connected to second group of memory cells 404. The bottom dummy word line DWLB0 and the ground select line GSL are also biased as the second pass voltage $V_{pass2}$. The first pass voltage $V_{pass1}$ and the second pass voltage $V_{pass2}$ are greater than the erase-verify voltage $V_{VFY}$. After applying the erase-verify voltage $V_{VFY}$ to the word lines connected to the first group of memory cells 402 and the second pass voltage $V_{pass2}$ to the word lines connected to second group of memory cells 404, if a sensing current flows through the memory cell string 400, the first group of memory cells is deemed as erased successfully and passes the first erase-verify operation. If the sensing current cannot flow through the memory cell string 400, the first group of memory cells is deemed as erased unsuccessfully and does not pass the first erase-verify operation. The first pass voltage $V_{pass1}$ is greater than the second pass voltage $V_{pass2}$.

If the first group of memory cells 402 passes the first erase-verify operation, the second erase-verify operation is performed on the second group of memory cells 404. In other words, the second erase-verify operation is performed on the second group of memory cells 404 in condition that the first group of memory cells 402 is deemed as erased successfully and passes the first erase-verify operation. When the controller 202 performs the second erase-verify operation on the second group of memory cells 404, as shown in FIG. 4B, the controller 202 provides the positive voltage (e.g. 1V) to the bit line BL and a voltage (e.g. 0V) to the common source line CSL. The controller 202 applies the erase-verify voltage $V_{VFY}$ (e.g. between 0V and 1V) to the word lines connected to the second group of memory cells 404, i.e. the erase-verify voltage $V_{VFY}$ is applied to the word lines WL0~WL3 and the bottom dummy word line DWLB1. In addition, the controller 202 applies a first pass voltage $V_{pass1}$ to the word lines connected to the first group of memory cells 402. The string select lines SSL0 and SSL1 and the top dummy word line DWLT1 are also biased as the first pass voltage $V_{pass1}$. The bottom dummy word line DWLB0 and the ground select line GSL are biased as the second pass voltage $V_{pass2}$. The second pass voltage $V_{pass2}$ is greater than the erase-verify voltage $V_{VFY}$. After applying the erase-verify voltage $V_{VFY}$ to the word lines connected to the second group of memory cells 404 and the first pass voltage $V_{pass1}$ to the word lines connected to first group of memory cells 402, if a sensing current flows through the memory cell string 400, the second group of memory cells is deemed as erased successfully and passes the second erase-verify operation. If the sensing current cannot flow through the memory cell string 400, the second group of memory cells is deemed as erased unsuccessfully and does not pass the second erase-verify operation. When the first group of memory cells 402 passes the first erase-verify operation and the second group of memory cells 404 passes the second erase-verify operation, the controller 202 sets the memory cell string 400 as erased successfully.

Figure 5A:
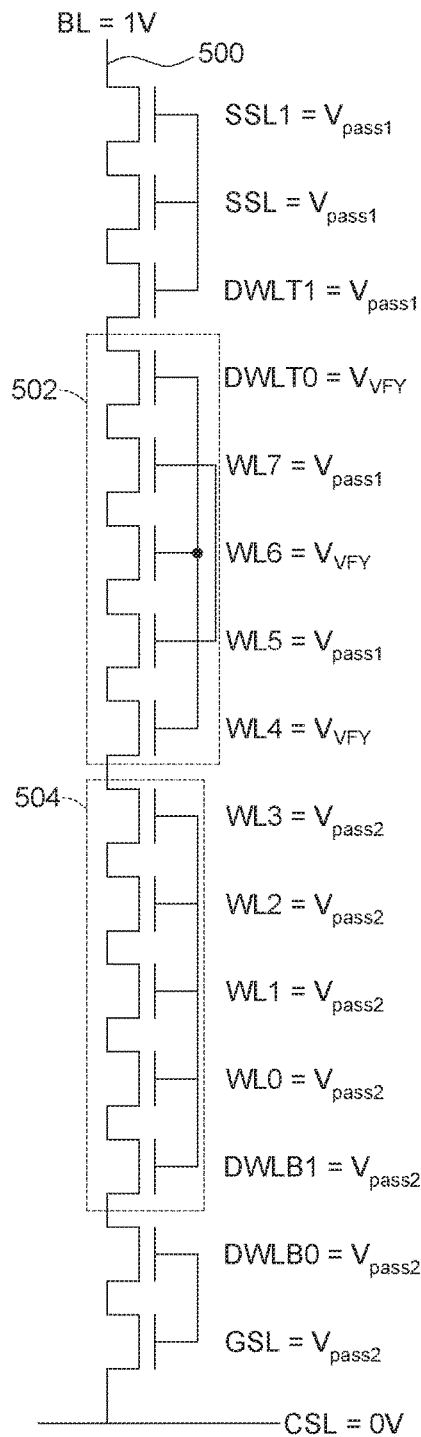
Figure 5B:
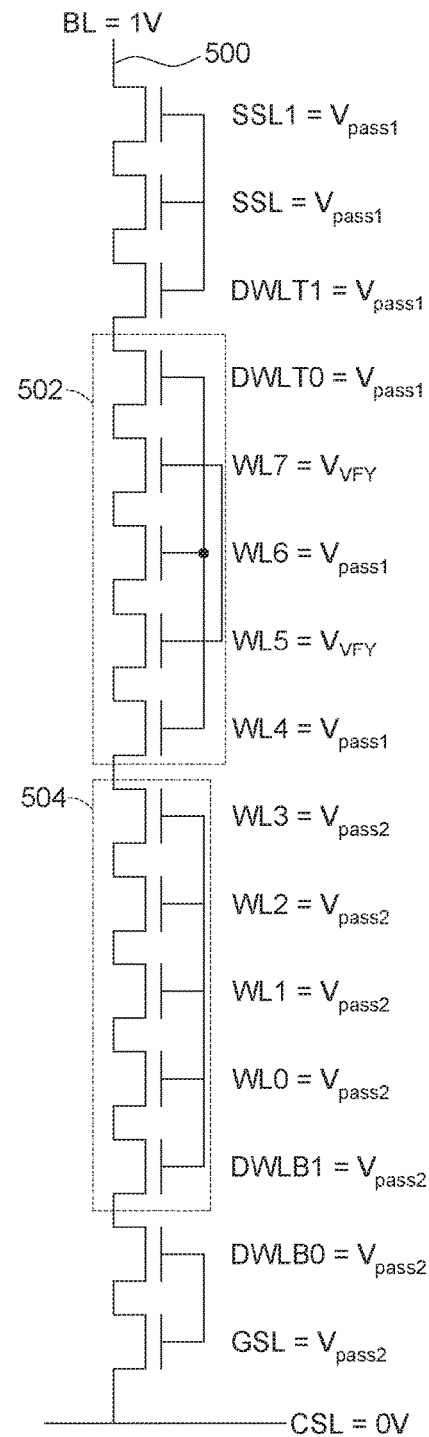

Please refer to FIGS. 5A, 5B and 5O. In this embodiment of the present invention, the memory cells of the memory cell string 500 include a first group of memory cells 502 and a second group of memory cells 504. FIG. 5A illustrates that a first phase of a first erase-verify operation only is performed on a first portion of a first group of memory cells 502, and FIG. 5B illustrates that a second phase of the first erase-verify operation only is performed on a second portion of the first group of memory cells 502. FIG. 5O illustrates that a second erase-verify operation is performed on a second group of memory cells 504. The first group of memory cells 502 comprises the memory cells connected to the word lines WL4, WL5, WL6, and WL7 and a dummy cell connected to the top dummy word line DWLT0. The second group of memory cells 504 comprises the memory cells connected to the word lines WL0, WL1, WL2, and WL3 and a dummy cell connected to the bottom dummy word line DWLB1. When the controller 202 performs the first erase-verify operation on the first group of memory cells 502 and the second erase-verify operation on the second group of memory cells 504, the controller 202 provides a positive voltage (e.g. 1V) to the bit line BL and a voltage (e.g. 0V) to the common source line CSL, the string select lines SSL0 and SSL1 and the top dummy word line DWLT1 are also biased as a first pass voltage $V_{pass1}$ and the bottom dummy word line DWLB0 and the ground select line GSL are biased as a second pass voltage $V_{pass2}$. The first pass voltage $V_{pass1}$ is greater than the second pass voltage $V_{pass2}$.

In this embodiment, the first erase-verify operation includes two phases, namely a first phase of the first erase-verify operation and a second phase of the first erase-verify operation. When the controller 202 performs the first erase-verify operation on the first group of memory cells 502, firstly, as shown in FIG. 5A, the controller 202 merely applies an erase-verify voltage $V_{VFY}$ to the word lines WL4 and WL6 and the top dummy word line DWLT0 coupled to the first group of memory cells 502 in the first phase of the first erase-verify operation. In other words, the controller 202 merely applies the erase-verify voltage $V_{VFY}$ to the word lines coupled to a first portion of the first group of memory cells 502 in the first phase of the first erase-verify operation. In addition, the controller 202 also applies the first pass voltage $V_{pass1}$ to the word lines WL5 and WL7 connected to the first group of memory cells 502 in the first phase of the first erase-verify operation. In other words, the controller 202 applies the first pass voltage $V_{pass1}$ to the word lines connected to a second portion of the first group of memory cells 502 in the first phase of the first erase-verify operation. The first pass voltage $V_{pass1}$ is greater than the erase-verify voltage $V_{VFY}$.

Secondly, after the first phase of the first erase-verify operation, as shown in FIG. 5B, the controller 202 applies the first pass voltage $V_{pass1}$ to the word lines WL4 and WL6 and the top dummy word line DWLT0 connected to the first group of memory cells 502 in the second phase of the first erase-verify operation. In other words, the controller 202 merely applies the first pass voltage $V_{pass1}$ to the word lines coupled to the first portion of the first group of memory cells 502 in the second phase of the first erase-verify operation. In addition, the controller 202 also applies the erase-verify voltage $V_{VFY}$ to the word lines WL5 and WL7 connected to the first group of memory cells 502 in the second phase of the first erase-verify operation. In other words, the controller 202 applies the erase-verify voltage $V_{VFY}$ to the word lines coupled to the second portion of the first group of memory cells 502 in the second phase of the first erase-verify operation. In the two phases of the first erase-verify operation, the controller 202 applies the second pass voltage $V_{pass2}$ to the word lines connected to the second group of memory cells 504.

If a sensing current flows through the memory cell string 500 in the first phase of the first erase-verify operation, the first portion of the first group of memory cells 502 are deemed as erased successfully and pass the first phase of the first erase-verify operation. If a sensing current flows through the memory cell string 500 in the second phase of the first erase-verify operation, the second portion of the first group of memory cells 502 are deemed as erased successfully and pass the second phase of the first erase-verify operation.

The first group of memory cells 502 passes the first erase-verify operation in condition that the first portion of the first group of memory cells 502 pass the first phase of the first erase-verify operation and the second portion of the first group of memory cells 502 pass the second phase of the first erase-verify operation. If in the first portion of the first group of memory cells 502 do not pass the first phase of the first erase-verify operation and/or the second portion of the first group of memory cells 502 do not pass the second phase of the first erase-verify operation, the first group of memory cells 502 does not pass the first erase-verify operation and is deemed as erased unsuccessfully.

Figure 5C:
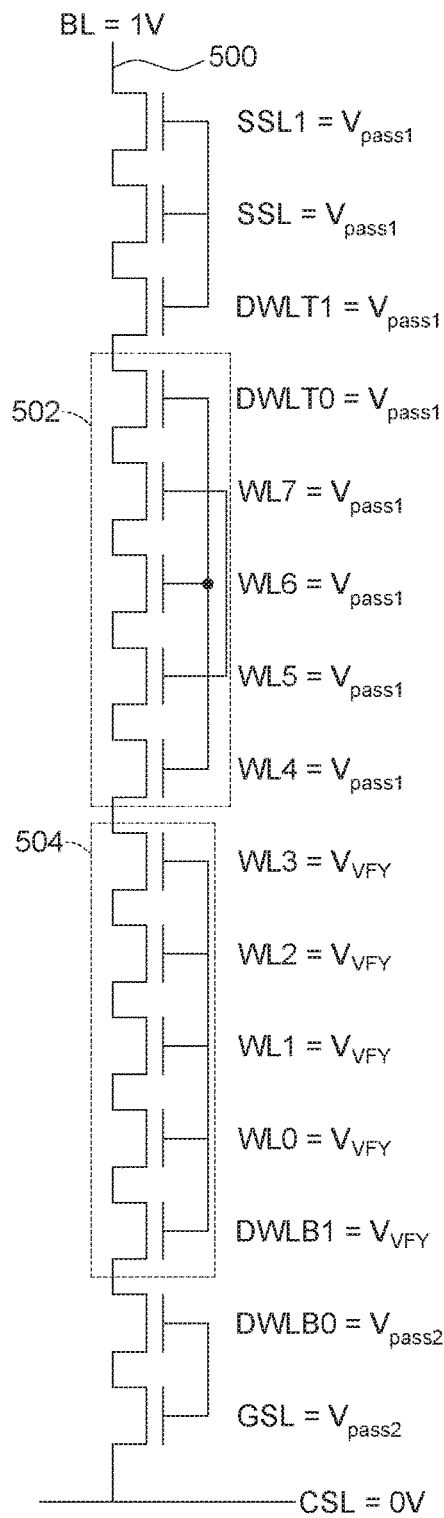

If the first group of memory cells 502 passes the two phases of the first erase-verify operation, the second erase-verify operation is performed on the second group of memory cells 504. In other words, the second erase-verify operation is performed on the second group of memory cells 504 in condition that the first group of memory cells 502 is deemed as erased successfully after the two phases of first erase-verify operation. When the controller 202 performs the second erase-verify operation on the second group of memory cells 504, as shown in FIG. 5C, the controller 202 applies the erase-verify voltage $V_{VFY}$ (e.g. between 0V and 1V) to the word lines connected to the second group of memory cells 504, i.e. the erase-verify voltage $V_{VFY}$ is applied to the word lines WL0~WL3 and the bottom dummy word line DWLB1. The controller 202 also applies the first pass voltage $V_{pass1}$ to the word lines connected to first group of memory cells 502. The second pass voltage $V_{pass2}$ is greater than the erase-verify voltage $V_{VFY}$. If a sensing current flows through the memory cell string 500, the second group of memory cells 504 is deemed as erased successfully and passes the second erase-verify operation. If the sensing current cannot flow through the memory cell string 500, the second group of memory cells 504 is deemed as erased unsuccessfully and does not pass the second erase-verify operation. When the first group of memory cells 502 passes the first erase-verify operation and the second group of memory cells 504 passes the second erase-verify operation, the controller 202 sets the memory cell string 500 as erased successfully and the erase-verify operation including the first erase-verify operation and the second erase-verify operation ends.

Figure 6A:
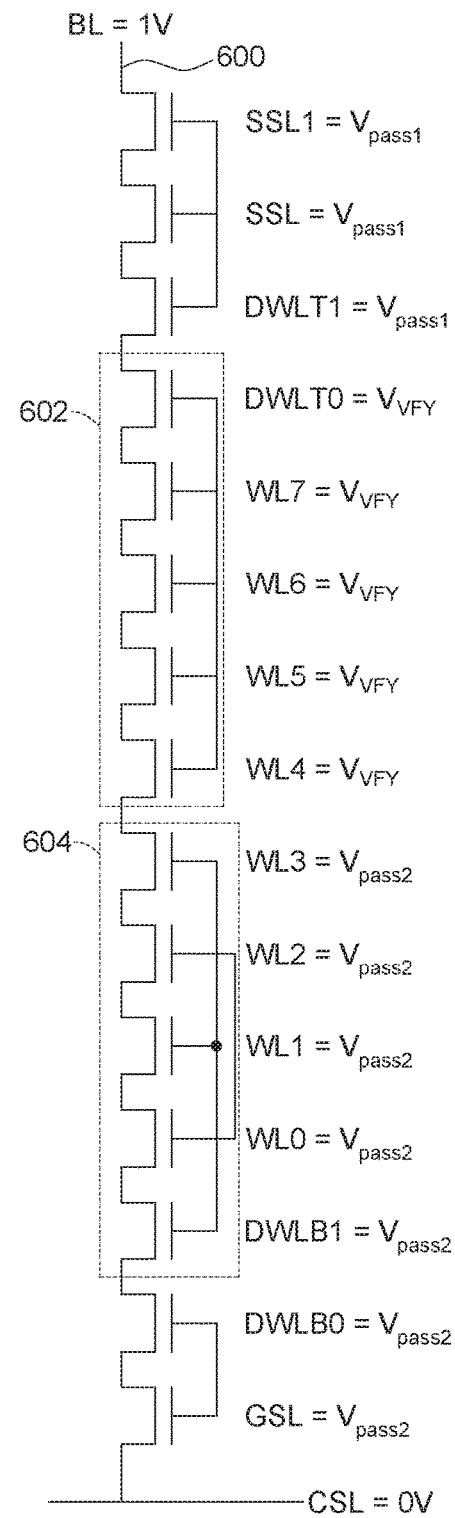

Please refer to FIGS. 6A, 6B and 6C. In this embodiment of the present invention, the memory cells of the memory cell string 600 include a first group of memory cells 602 and a second group of memory cells 604. FIG. 6A illustrates that a first erase-verify operation only is performed on a first group of memory cells 602. FIG. 6B illustrates that a first phase of a second erase-verify operation only is performed on a first portion of a second group of memory cells 604, and FIG. 6C illustrates that a second phase of the second erase-verify operation only is performed on a second portion of the second group of memory cells 604. The first group of memory cells 602 comprises the memory cells connected to the word lines WL4, WL5, WL6, and WL7 and a dummy cell connected to the top dummy word line DWLT0. The second group of memory cells 604 comprises the memory cells connected to the word lines WL0, WL1, WL2, and WL3 and a dummy cell connected to the bottom dummy word line DWLB1. When the controller 202 performs the first erase-verify operation on the first group of memory cells 602 and the second erase-verify operation on the second group of memory cells 604, the controller 202 provides a positive voltage (e.g. 1V) to the bit line BL and a voltage (e.g. 0V) to the common source line CSL, the string select lines SSL0 and SSL1 and the top dummy word line DWLT1 are also biased as a first pass voltage and the bottom dummy word line DWLB0 and the ground select line GSL are biased as a second pass voltage $V_{pass2}$. The first pass voltage $V_{pass1}$ is greater than the second pass voltage $V_{pass2}$.

When the controller 202 performs the first erase-verify operation on the first group of memory cells 602, as shown in FIG. 6A, the controller 202 applies the erase-verify voltage $V_{VFY}$ (e.g. between 0V and 1V) to the word lines connected to the first group of memory cells 602, i.e. the erase-verify voltage $V_{VFY}$ is applied to the word lines WL4~WL7 and the top dummy word line DWLT0. The controller 202 also applies the second pass voltage $V_{pass2}$ to the word lines connected to the second group of memory cells 604. The first pass voltage $V_{pass1}$ is greater than the erase-verify voltage $V_{VFY}$. After applying the erase-verify voltage $V_{VFY}$ to the word lines connected to the first group of memory cells 602 and the second pass voltage $V_{pass2}$ to the word lines connected to second group of memory cells 604, if a sensing current flows through the memory cell string 600, the first group of memory cells 602 is deemed as erased successfully and passes the first erase-verify operation. If the sensing current cannot flow through the memory cell string 600, the first group of memory cells 602 is deemed as erased unsuccessfully and does not pass the first erase-verify operation.

After the first group of memory cells 602 passes the first erase-verify operation, the second erase-verify operation is perform on the second group of memory cells 604. In other words, the second erase-verify operation is performed on the second group of memory cells 604 in condition that the first group of memory cells 602 is deemed as erased successfully and passes the first erase-verify operation. In this embodiment, the second erase-verify operation includes two phases, namely a first phase of the second erase-verify operation and a second phase of the second erase-verify operation.

When the controller 202 performs the second erase-verify operation on the second group of memory cells 604, firstly, as shown in FIG. 6B, the controller 202 merely applies the erase-verify voltage $V_{VFY}$ to the word lines WL1 and WL3 and the bottom dummy word line DWLB1 coupled to the second group of memory cells 604 in the first phase of the second erase-verify operation. In other words, the controller 202 merely applies the erase-verify voltage $V_{VFY}$ to the word lines connected to a first portion of the second group of memory cells 604 in the first phase of the second erase-verify operation. In addition, the controller 202 also applies the second pass voltage $V_{pass2}$ to the word lines WL0 and WL2 connected to the second group of memory cells 604 in the first phase of the second erase-verify operation. In other words, the controller 202 applies the second pass voltage $V_{pass2}$ to the word lines connected to a second portion of the second group of memory cells 604 in the first phase of the second erase-verify operation. The second pass voltage $V_{pass2}$ is greater than the erase-verify voltage $V_{VFY}$.

Secondly, after the first phase of the second verify operation, as shown in FIG. 6O, the controller 202 applies the second pass voltage $V_{pass2}$ to the word lines WL1 and WL3 and the bottom dummy word line DWLB1 connected to the second group of memory cells 604 in the second phase of the second erase-verify operation. In other words, the controller 202 applies the second pass voltage $V_{pass2}$ to the word lines coupled to the first portion of the second group of memory cells 604 in the second phase of the second verify operation. In addition, the controller 202 also applies the erase-verify voltage $V_{VFY}$ to the word lines WL0 and WL2 connected to the second group of memory cells 604 in the second phase of the second erase-verify operation. In other words, the controller 202 applies the erase-verify voltage $V_{VFY}$ to the word lines coupled to the second portion of the second group of memory cells 604 in the second phase of the second erase-verify operation. In the two phases of the second erase-verify operation, the controller 202 applies the first pass voltage $V_{pass1}$ to the word lines connected to the first group of memory cells 602.

If a sensing current flows through the memory cell string 600 in the first phase of the second erase-verify operation, the first portion of the second group of memory cells 604 are deemed as erased successfully and pass the first phase of the second erase-verify operation. If the sensing current flows through the memory cell string 600 in the second phase of the second erase-verify operation, the second portion of the second group of memory cells 604 are deemed as erased successfully and pass the second phase of the second erase-verify operation.

The second group of memory cells 604 passes the second erase-verify operation in condition that the first portion of the second group of memory cells 604 pass the first phase of the second erase-verify operation and the second portion of the second group of memory cells 604 pass the second phase of the second erase-verify operation. If the first portion of the second group of memory cells 604 do not pass the first phase of the second erase-verify operation and/or the second portion of the second group of memory cells 604 do not pass the second phase of the second erase-verify operation, the second group of memory cells 604 does not pass the second erase-verify operation and is deemed as erased unsuccessfully.

When the first group of memory cells 602 passes the first erase-verify operation and the second group of memory cells 604 passes the second erase-verify operation, the controller 202 sets the memory cell string 600 as erased successfully and an erase-verify operation including the first erase-verify operation and the second erase-verify operation ends.

Figure 7A:
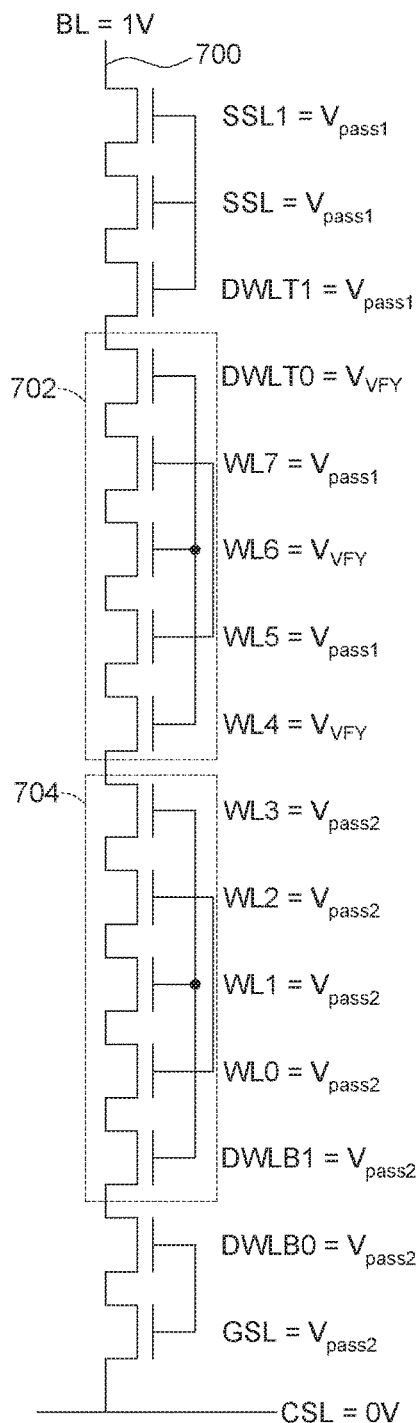
Figure 7B:
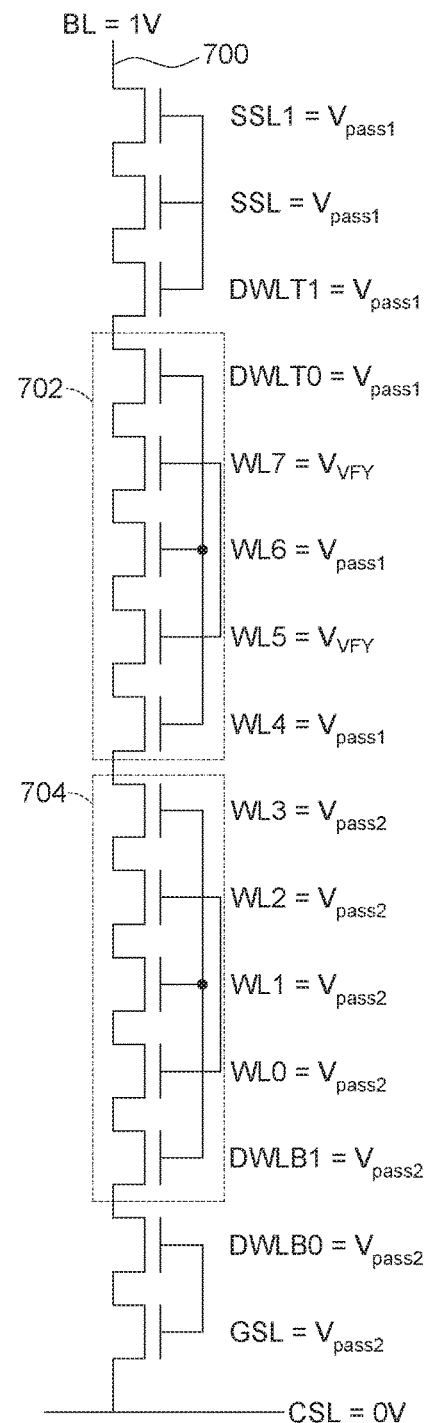
Figure 7C:
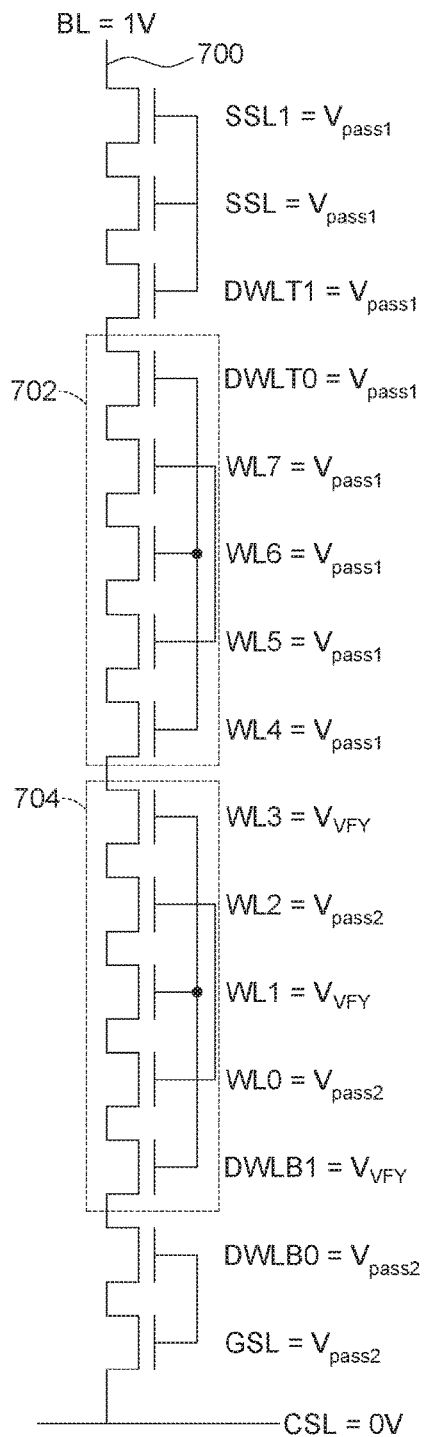
Figure 7D:
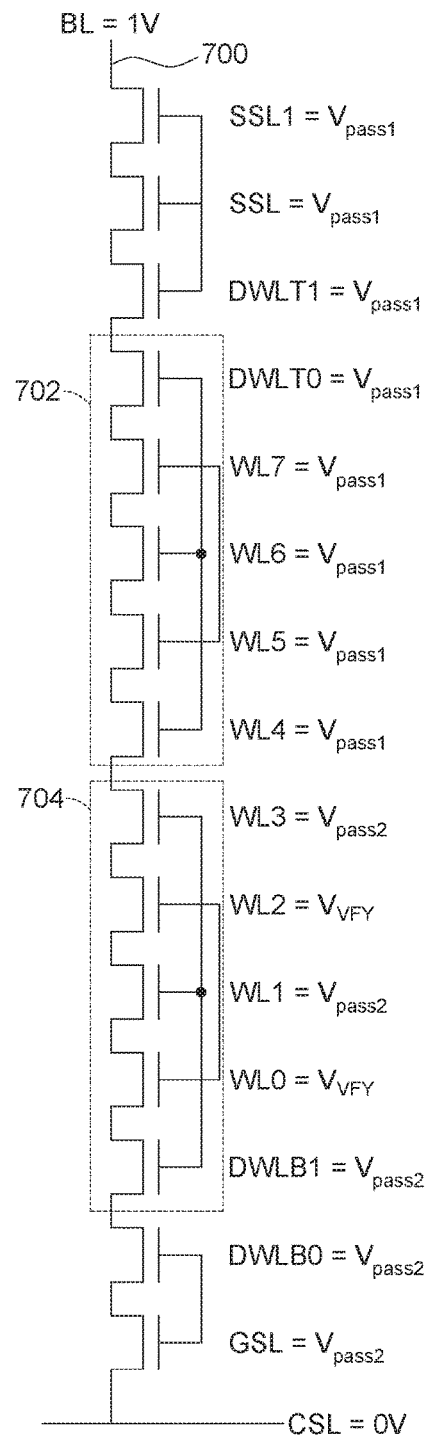

Please refer to FIGS. 7A to 7D. In this embodiment of the present invention, the memory cells of the memory cell string 700 include a first group of memory cells 702 and a second group of memory cells 704. FIG. 7A illustrates that a first phase of a first erase-verify operation only is performed on a first portion of the first group of memory cells 702, and FIG. 7B illustrates that a second phase of a first erase-verify operation only is performed on a second portion of the first group of memory cells 702. FIG. 7C illustrates that a first phase of a second erase-verify operation only is performed on a first portion of the second group of memory cells 704, and FIG. 7D illustrates that a second phase of a second erase-verify operation only is performed on a second portion of the second group of memory cells 704. The first group of memory cells 702 comprises the memory cells connected to the word lines WL4, WL5, WL6, and WL7 and a dummy cell connected to the top dummy word line DWLT0. The second group of memory cells 704 comprises the memory cells connected to the word lines WL0, WL1 WL2, and WL3 and a dummy cell connected to the bottom dummy word line DWLB1. When the controller 202 performs the first erase-verify operation on the first group of memory cells 702 and the second erase-verify operation on the second group of memory cells 704, the controller 202 provides a positive voltage (e.g. 1V) to the bit line BL and a voltage (e.g. 0V) to the common source line CSL, the string select lines SSL0 and SSL1 and the top dummy word line DWLT1 are also biased as a first pass voltage $V_{pass1}$, and the bottom dummy word line DWLB0 and the ground select line GSL are biased as a second pass voltage $V_{pass2}$. The first pass voltage $V_{pass1}$ is greater than the second pass voltage $V_{pass2}$.

In this embodiment, the first erase-verify operation includes two phases, namely a first phase of the first erase-verify operation and a second phase of the first erase-verify operation. When the controller 202 performs the first erase-verify operation on the first group of memory cells 702, firstly, as shown in FIG. 7A, the controller 202 merely applies an erase-verify voltage $V_{VFY}$ to the word lines WL4 and WL6 and the top dummy word line DWLT0 coupled to the first group of memory cells 702 in the first phase of the first erase-verify operation. In other words, the controller 202 merely applies the erase-verify voltage $V_{VFY}$ to the word lines coupled to a first portion of the first group of memory cells 702 in the first phase of the first erase-verify operation. In addition, the controller 202 also applies the first pass voltage $V_{pass1}$ to the word lines WL5 and WL7 connected to the first group of memory cells 702 in the first phase of the first erase-verify operation. In other words, the controller 202 applies the first pass voltage $V_{pass1}$ to the word lines connected to a second portion of the first group of memory cells 702 in the first phase of the first erase-verify operation. The first pass voltage $V_{pass1}$ is greater than the erase-verify voltage $V_{VFY}$.

Secondly, after the first phase of the first verify operation, as shown in FIG. 7B, the controller 202 applies the first pass voltage $V_{pass1}$ to the word lines WL4 and WL6 and the top dummy word line DWLT0 connected to the first group of memory cells 702 in the second phase of the first erase-verify operation. In other words, the controller 202 merely applies the first pass voltage $V_{pass1}$ to the word lines coupled to the first portion of the first group of memory cells 702 in the second phase of the first erase-verify operation. In addition, the controller 202 also applies the erase-verify voltage $V_{VFY}$ to the word lines WL5 and WL7 connected to the first group of memory cells 702 in the second phase of the first erase-verify operation. In other words, the controller 202 applies the erase-verify voltage $V_{VFY}$ to the word lines coupled to the second portion of the first group of memory cells 702 in the second phase of the first erase-verify operation. In the two phases of the first erase-verify operation, the controller 202 applies the second pass voltage $V_{pass2}$ to the word lines connected to second group of memory cells 704.

If a sensing current flows through the memory cell string 700 in the first phase of the first erase-verify operation, the first portion of the first group of memory cells 702 is deemed as erased successfully and pass the first phase of the first erase-verify operation. If the sensing current flows through the memory cell string 700 in the second phase of the first erase-verify operation, the second portion of the first group of memory cells 702 is deemed as erased successfully and pass the second phase of the first erase-verify operation.

The first group of memory cells 702 passes the first erase-verify operation in condition that the first portion of the first group of memory cells 702 pass the first phase of the first erase-verify operation and the second portion of the first group of memory cells 702 pass the second phase of the first erase-verify operation. If the first portion of the first group of memory cells 702 do not pass the first phase of the first erase-verify operation and/or the second portion of the first group of memory cells 702 do not pass the second phase of the first erase-verify operation, the first group of memory cells 702 does not pass the first erase-verify operation and is deemed as erased unsuccessfully.

After the first group of memory cells 702 passes the first erase-verify operation, the second erase-verify operation is performed on the second group of memory cells 704. In other words, the second erase-verify operation is performed on the second group of memory cells 704 in condition that the first group of memory cells 702 is deemed as erased successfully and passes the first erase-verify operation after the two phases of the first erase-verify operation. In this embodiment, the second erase-verify operation includes two phases, namely a first phase of the second erase-verify operation and a second phase of the second erase-verify operation.

When the controller 202 performs the second erase-verify operation on the second group of memory cells 704, firstly, as shown in FIG. 7C, the controller 202 merely applies an erase-verify voltage $V_{VFY}$ to the word lines WL1 and WL3 and the bottom dummy word line DWLB1 coupled to the second group of memory cells 704 in the first phase of the second erase-verify operation. In other words, the controller 202 merely applies the erase-verify voltage $V_{VFY}$ to the word lines connected to a first portion of the second group of memory cells 704 in the first phase of the second erase-verify operation. In addition, the controller 202 also applies the second pass voltage $V_{pass2}$ to the word lines WL0 and WL2 connected to the second group of memory cells 704 in the first phase of the second erase-verify operation. In other words, the controller 202 applies the second pass voltage $V_{pass2}$ to the word lines connected to a second portion of the second group of memory cells 704 in the first phase of the second erase-verify operation. The second pass voltage $V_{pass2}$ is greater than the erase-verify voltage $V_{VFY}$.

Secondly, after the first phase of the second verify operation, as shown in FIG. 7D, the controller 202 applies the second pass voltage $V_{pass2}$ to the word lines WL1 and WL3 and the bottom dummy word line DWLB1 connected to the second group of memory cells 704 in the second phase of the second erase-verify operation. In other words, the controller 202 applies the second pass voltage $V_{pass2}$ to the word lines connected to the first portion of the second group of memory cells 704 in the second phase of the second verify operation. In addition, the controller 202 also applies the erase-verify voltage $V_{VFY}$ to the word lines WL0 and WL2 connected to the second group of memory cells 704 in the second phase of the second erase-verify operation. In other words, the controller 202 applies the erase-verify voltage $V_{VFY}$ to the word lines coupled to the second portion of the second group of memory cells 704 in the second phase of the second erase-verify operation. In the two phases of the second erase-verify operation, the controller 202 applies the first pass voltage $V_{pass1}$ to the word lines connected to the first group of memory cells 702.

If a sensing current flows through the memory cell string 700 in the first phase of the second erase-verify operation, the first portion of the second group of memory cells 704 are deemed as erased successfully and pass the first phase of the second erase-verify operation. If a sensing current flows through the memory cell string 700 in the second phase of the second erase-verify operation, the second portion of the second group of memory cells 704 are deemed as erased successfully and pass the second phase of the first erase-verify operation.

The second group of memory cells 704 passes the second erase-verify operation in condition that the first portion of the second group of memory cells 704 pass the first phase of the second erase-verify operation and the second portion of the second group of memory cells 704 pass the second phase of the second erase-verify operation. If the first portion of the second group of memory cells 704 do not pass the first phase of the second erase-verify operation and/or the second portion of the second group of memory cells 704 do not pass the second phase of the second erase-verify operation, the second group of memory cells 704 does not pass the second erase-verify operation and is deemed as erased unsuccessfully.

When the first group of memory cells 702 passes the first erase-verify operation and the second group of memory cells 704 passes the second erase-verify operation, the controller 202 sets the memory cell string 700 as erased successfully and an erase-verify operation including the first erase-verify operation and the second erase-verify operation ends.

In some embodiments of the present invention, the first portion of the first/second group of memory cells are connected to the odd word lines of the word lines coupled to the first/second group of memory cells, and the memory cells in the second portion of the first/second group of memory cells are connected to the even word lines of the word lines coupled to the first/second group of memory cells. In the other embodiments of this invention, the memory cells in the first portion of the first/second group of memory cells are connected to the even word lines of the word lines coupled to the first/second group of memory cells, and the memory cells in the second portion of the first/second group of memory cells are connected to the odd word lines of the word lines coupled to the first/second group of memory cells. The first portion of the first/second group of memory cells is different from the second portion of the first/second group of memory cells. For example, the first portion of the first/second group of memory cells is odd memory cells of the first/second group of memory cells, and the second portion of the first/second group of memory cells is even memory cells of the first/second group of memory cells.

In the above embodiments of present invention, because the spatial position of the first group of memory cells is higher than the spatial position of the second group of memory cells, taking a substrate of the 30 memory 204 as a base, the first pass voltage $V_{pass1}$ is set as greater than the second pass voltage $V_{pass2}$ to make the influence of electric field of the first pass voltage $V_{pass1}$ and the influence of electric field of the second pass voltage $V_{pass2}$ the same or approximately the same. In other embodiments of this invention, the first pass voltage $V_{pass1}$ could be equal to or less than the second pass voltage $V_{pass2}$.

In the embodiments of the present invention, memory cells of a memory cell string are grouped into at least two groups of memory cells, and multiple erase-verify operations are separately performed on different groups of memory cells. Only when an erase-verify operation performed on a group of memory cells has passed, a subsequent erase-verify operation could be performed on a subsequent group of memory cells. When an erase-verify operation performed on a group of memory cells does not pass, an erase voltage would be increased and the increased erase voltage would be applied on the memory cell string to erase the memory cell string. The probability of increasing the erase voltage and applying the increased erase voltage would be reduced by grouping memory cells of a memory cells into several groups and performing individual erase-verify operations on different groups of memory cells. In addition, an erase-verify operation can include two phases. One of the two phases of the erase-verify operation is performed on word lines connected to a first portion of a group of memory cells, e.g. odd word lines, and then another of the two phases of the erase-verify operation is performed on word lines connected to a second portion of the group of memory cells, e.g. even word lines, so that an erase-verify failure induced by residual charges would be mitigated.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An erase-verify method for a three-dimensional (3D) memory, the 3D memory including at least one memory cell string including a plurality of memory cells, the memory cells including a first group of memory cells and a second group of memory cells, each of the memory cells coupled to a word line, the erase-verify method comprising:
   performing a first erase-verify operation on the first group of memory cells, wherein the first erase-verify operation comprises:
   applying an erase-verify voltage to the word lines coupled to a first portion of the first group of memory cells and a first pass voltage to the word lines coupled to a second portion of the first group of memory cells in a first phase of the first erase-verify operation, the second portion of the first group of memory cells is different from the first portion of the first group of memory cells; and
   after the first phase of the first erase-verify operation, applying the erase-verify voltage to the word lines coupled to the memory cells in the second portion of the first group of memory cells and the first pass voltage to the word lines coupled to the memory cells in the first portion of the first group of memory cells in a second phase of the first erase-verify operation; and
   after performing the first erase-verify operation on the first group of memory cells, performing a second erase-verify operation on the second group of memory cells in condition that the first group of memory cells are verified as erased successfully, wherein the second erase-verify operation comprises:
   applying the erase-verify voltage to the word lines coupled to a first portion of the second group of memory cells and a second pass voltage to the word lines coupled to a second portion of the second group of memory cells in a first phase of the second erase-verify operation, the second portion of the second group of memory cells is different from the first portion of the second group of memory cells; and
   after the first phase of the first erase-verify operation, applying the verify voltage to the word lines coupled to the second portion of the second group of memory cells and the second pass voltage to the word lines coupled to the first portion of the second group of memory cells in a second phase of the second erase-verify operation.

2. The erase-verify method according to claim 1, wherein the first group of memory cells is adjacent to one another, and the second group of memory cells is adjacent to one another.

3. The erase-verify method according to claim 1, wherein the first pass voltage is greater than the second pass voltage.

4. The erase-verify method according to claim 1, wherein the word lines includes interleaving even and odd word lines, the first portion of the first group of memory cells are connected to the odd word lines of the word lines coupled to the first group of memory cells, and the second portion of the first group of memory cells are connected to the even word lines of the word lines coupled to the first group of memory cells.

5. The erase-verify method according to claim 1, wherein the word lines includes interleaving even and odd word lines, the first portion of the second group of memory cells are connected to the odd word lines of the word lines coupled to the second group of memory cells, and the second portion of the second group of memory cells are connected to the even word lines of the word lines coupled to the second group of memory cells.

6. The erase-verify method according to claim 1, further comprising:
increasing an erase voltage in condition that the first group of memory cells is verified as erased unsuccessfully or the second group of memory cells is verified as erased unsuccessfully; and
applying the increased erase voltage to erase the at least one memory cell string.

7. A memory system, comprising:
a three dimensional (3D) memory, including at least one memory cell string extending vertically through layers of the 3D memory, the at least one memory cell string including a plurality of memory cells, the memory cells including a first group of memory cells and a second group of memory cells, each of the memory cells coupled to a word line; and
a controller, coupled to the 3D memory, for performing a first erase-verify operation on the first group of memory cells, wherein the first erase-verify operation comprises that the controller applies a erase-verify voltage to the word lines coupled to a first portion of the first group of memory cells and a first pass voltage to the word lines coupled to a second portion of the first group of memory cells in a first phase of the first erase-verify operation, and after the first phase of the first erase-verify operation, the controller applies the erase-verify voltage to the word lines coupled to the second portion of the first group of memory cells and the first pass erase-voltage to the word lines coupled to the first portion of the first group of memory cells in a second phase of the first erase-verify operation, wherein the second portion of the first group of memory cells is different from the first portion of the first group of memory cells;
and after performing the first erase-verify operation on the first group of memory cells, performing a second erase-verify operation on the second group of memory cells in condition that the first group of memory cells are verified as erased successfully, wherein the second erase-verify operation comprises that the controller applies the erase-verify voltage to the word lines coupled to a first portion of the second group of memory cells and a second pass voltage to the word lines coupled to a second portion of the second group of memory cells in a first phase of the second erase-verify operation, and after the first phase of the first erase-verify operation, the controller applies the erase-verify voltage to the word lines coupled to the second portion of the second group of memory cells and the second pass voltage to the word lines coupled to the first portion of the second group of memory cells in a second phase of the second erase-verify operation, wherein the second portion of the second group of memory cells is different from the first portion of the second group of memory cells.

8. The memory system according to claim 7, wherein the first group of memory cells is adjacent to one another, and the second group of memory cells is adjacent to one another.

9. The memory system according to claim 7, wherein the first pass voltage is greater than the second pass voltage.

10. The memory system according to claim 7, wherein the word lines includes interleaving even and odd word lines, the first portion of the first group of memory cells is connected to the odd word lines of the word lines coupled to the first group of memory cells, and the second portion of the first group of memory cells is connected to the even word lines of the word lines coupled to the first group of memory cells.

11. The memory system according to claim 7, wherein the word lines includes interleaving even and odd word lines, the first portion of the second group of memory cells is connected to the odd word lines of the word lines coupled to the second group of memory cells, and the second portion of the second group of memory cells is connected to the even word lines of the word lines coupled to the second group of memory cells.

12. The memory system according to claim 7, wherein the controller further increases an erase voltage in condition that the first group of memory cells is verified as erased unsuccessfully or the second group of memory cells is verified as erased unsuccessfully and applies the increased erase voltage to erase the at least one memory cell string.

* * * * *